United States Patent
König et al.

(10) Patent No.: US 10,756,173 B2
(45) Date of Patent: Aug. 25, 2020

(54) DIODE COMPRISING A SEMICONDUCTOR BODY

(71) Applicant: SEMIKRON ELEKTRONIK GMBH & CO. KG, Nuremberg (DE)

(72) Inventors: Bernhard König, Fürth (DE); Paul Strobel, Nuremberg (DE)

(73) Assignee: SEMIKRON ELEKTRONIK GmbH & CO. KG, Nuremberg (DE)

( * ) Notice: Subject to any disclaimer, the term of this patent is extended or adjusted under 35 U.S.C. 154(b) by 0 days.

(21) Appl. No.: 16/413,758

(22) Filed: May 16, 2019

(65) Prior Publication Data
US 2019/0378896 A1   Dec. 12, 2019

(30) Foreign Application Priority Data
Jun. 7, 2018 (DE) .......................... 10 2018 113 573

(51) Int. Cl.
| H01L 29/06 | (2006.01) |
| H01L 29/16 | (2006.01) |
| H01L 29/861 | (2006.01) |
| H01L 29/36 | (2006.01) |

(52) U.S. Cl.
CPC .......... *H01L 29/0661* (2013.01); *H01L 29/16* (2013.01); *H01L 29/1608* (2013.01); *H01L 29/36* (2013.01); *H01L 29/8613* (2013.01)

(58) Field of Classification Search
None
See application file for complete search history.

(56) References Cited

U.S. PATENT DOCUMENTS

| 4,047,196 A * | 9/1977 | White ................. H01L 23/3171 |
| | | 257/496 |
| 4,215,358 A * | 7/1980 | Wataze ............... H01L 29/0638 |
| | | 257/438 |
| 4,373,255 A * | 2/1983 | Goronkin .............. H01L 23/142 |
| | | 257/625 |

(Continued)

FOREIGN PATENT DOCUMENTS

| CN | 103578978 | 2/2014 |
| EP | 1 722 423 | 11/2006 |

OTHER PUBLICATIONS

DE 10 2018 113 573.4, German Examination Report dated Mar. 11, 2019, 6 pages—German, 2 pages—English.

*Primary Examiner* — Lex H Malsawma
(74) *Attorney, Agent, or Firm* — Lackenbach Siegel, LLP; Andrew F. Young

(57) ABSTRACT

A diode has a semiconductor body having a first and a second semiconductor body main side. The semiconductor body has a first semiconductor zone. The semiconductor body has a second semiconductor zone arranged on the first semiconductor zone in an inner region of the semiconductor body and not extending as far as the semiconductor body edge of the semiconductor body. The semiconductor body has a third semiconductor zone arranged on the second semiconductor zone and has a higher doping concentration than the second semiconductor zone. The semiconductor body has a fourth semiconductor zone arranged on the first semiconductor zone in a semiconductor body edge region and extending from the second semiconductor zone in the direction towards the semiconductor body edge as far as the semiconductor body edge.

16 Claims, 2 Drawing Sheets

(56) References Cited

U.S. PATENT DOCUMENTS

| | | | | |
|---|---|---|---|---|
| 4,740,477 A * | 4/1988 | Einthoven | ............... | H01L 29/36 438/10 |
| 4,999,684 A * | 3/1991 | Temple | ................... | H01L 21/78 257/517 |
| 5,166,769 A * | 11/1992 | Einthoven | ............... | H01L 21/22 257/496 |
| 5,930,660 A * | 7/1999 | Davis | .................. | H01L 29/0661 257/496 |
| 6,121,633 A * | 9/2000 | Singh | ................. | H01L 29/1608 257/212 |
| 6,459,133 B1 * | 10/2002 | Brown | ................ | H01L 29/8618 257/361 |
| 7,482,669 B2 * | 1/2009 | Van Dalen | ............ | H01L 29/861 257/497 |
| 8,384,126 B2 * | 2/2013 | Rodrigues | ........... | H01L 29/0661 257/173 |
| 2004/0075160 A1 * | 4/2004 | Eng | ..................... | H01L 29/0661 257/623 |
| 2010/0032685 A1 | 2/2010 | Zhang et al. | | |
| 2014/0327114 A1 * | 11/2014 | Barthelmess | ....... | H01L 29/0623 257/618 |
| 2015/0069416 A1 | 3/2015 | Ota et al. | | |

* cited by examiner

DIODE COMPRISING A SEMICONDUCTOR BODY

CROSS REFERENCE TO RELATED APPLICATIONS

This application relates to, and claims priority from, DE Ser. No. 10 2018 113 573.4 filed Jun. 7, 2018, the entire contents of which are incorporated herein by reference.

FIGURE SELECTED FOR PUBLICATION

FIG. 1.

BACKGROUND OF THE INVENTION

Field of the Invention

The present invention relates to a diode comprising a semiconductor body.

Description of the Related Art

In the case of diodes, in particular, there is often the need to reduce electrical field strengths occurring at the edge region of the semiconductor body of the diodes in order to avoid electrical flashovers. Furthermore, diodes are also intended to be producible in an efficient manner.

EP 1 722 423 A2 discloses a diode comprising a semiconductor body having a first semiconductor body main side, a second semiconductor body main side arranged opposite the first semiconductor body main side, and a semiconductor body edge extending circumferentially around the semiconductor body and connecting the first and second semiconductor body main sides, wherein the semiconductor body has a p type semiconductor zone having an outer surface, which forms the first semiconductor body main side, and a further p doped semiconductor zone arranged on the p doped semiconductor zone in a semiconductor body edge region of the semiconductor body and extending as far as the second semiconductor body main side.

ASPECTS AND SUMMARY OF THE INVENTION

It is an object of the invention to provide an efficiently producible diode comprising a semiconductor body in which electric field strengths that occur at the edge region of the semiconductor body of the diode are reduced.

This object is achieved by means of a diode comprising a semiconductor body having a first semiconductor body main side, a second semiconductor body main side arranged opposite the first semiconductor body main side, and a semiconductor body edge extending circumferentially around the semiconductor body and connecting the first and second semiconductor body main sides, wherein the semiconductor body has a first semiconductor zone of a first conduction type, wherein a first outer surface of the first semiconductor zone forms the first semiconductor body main side, wherein a second outer surface of the first semiconductor zone forms a section of the semiconductor body edge, wherein the semiconductor body has a second semiconductor zone of a second conduction type, said second semiconductor zone being arranged on the first semiconductor zone in an inner region of the semiconductor body and not extending as far as the semiconductor body edge, wherein the semiconductor body has a third semiconductor zone of the second conduction type, said third semiconductor zone being arranged on the second semiconductor zone and having a higher doping concentration than the second semiconductor zone, wherein the semiconductor body has a fourth semiconductor zone of the first conduction type, said fourth semiconductor zone being arranged on the first semiconductor zone in a semiconductor body edge region and extending from the second semiconductor zone in the direction towards the semiconductor body edge as far as the semiconductor body edge, wherein the semiconductor body has a cutout proceeding from a planar outer surface of the third semiconductor zone, which forms a surface region of the second semiconductor body main side, and reaching as far as the semiconductor body edge, said cutout extending along the semiconductor body edge, wherein the second, third and fourth semiconductor zones have a respective outer interface bounding the cutout.

It proves to be advantageous if the entire first semiconductor body main side is formed in a planar fashion. Consequently, the semiconductor body does not have a further cutout proceeding from the first semiconductor body main side and reaching into the semiconductor body. The diode can thus easily be contacted e.g. with a substrate (e.g. DCB substrate) by means of a sintering connection since the application of pressure to the diode that is necessary for producing the sintering connection cannot result in an edge facet of the semiconductor body breaking away.

Furthermore, it proves to be advantageous if the outer interface of the second semiconductor zone and the outer interface of the third semiconductor zone have a concave course in the direction towards the semiconductor body edge, since electric field strengths that occur at the edge structure of the semiconductor body are then reduced further.

In this context it proves to be advantageous if the outer interface of the fourth semiconductor zone has a concave course in the direction towards the semiconductor body edge, since electric field strengths that occur at the edge structure of the semiconductor body are then further reduced.

Furthermore, it proves to be advantageous if the outer interface of the fourth semiconductor zone and a section of the outer interface of the second semiconductor zone are formed in a planar fashion, since the depression can then be produced in a simple manner.

In this context it proves to be advantageous if the respective normal direction relative to the section of the outer interface of the second semiconductor zone and the outer interface of the fourth semiconductor zone corresponds to the normal direction relative to the outer surface of the third semiconductor zone, since the depression can then be produced in a particularly simple manner, e.g. by means of a dry etching process.

Furthermore, it proves to be advantageous if the semiconductor body edge extends from the first to the second semiconductor body main side parallel to the normal direction relative to the outer surface of the third semiconductor zone, since a semiconductor body edge is then formed in a particularly simple manner.

Furthermore, it proves to be advantageous if the fourth semiconductor zone has its highest doping concentration at its outer interface, wherein the doping concentration of the fourth semiconductor zone decreases in the direction towards the first semiconductor body main side, since such a doping concentration can be produced in an efficient manner.

Furthermore, it proves to be advantageous if the fourth semiconductor zone has its highest doping concentration at its boundary with the first semiconductor zone, wherein the doping concentration of the fourth semiconductor zone decreases in the direction towards the second semiconductor body main side, since such a doping profile can be produced in an efficient manner.

Furthermore, it proves to be advantageous if the highest doping concentration of the fourth semiconductor zone is less than 1×1018 cm 3, in particular less than 1×1017 cm 3, since the reverse voltage loading capacity of the diode is increased as a result.

Furthermore, it proves to be advantageous if a silicon oxide layer is arranged at least on one of the outer interfaces of the second, third and fourth semiconductor zones.

In this context it proves to be advantageous if a polyimide layer or glass layer is arranged on the silicon oxide layer.

Furthermore, it proves to be advantageous if a polyimide layer or glass layer is arranged at least on one of the respective outer interfaces of the second, third and fourth semiconductor zones.

By using a polyimide layer, if appropriate in interaction with a silicon oxide layer or glass layer, a very reliable passivation of the respective outer interface is achieved.

Furthermore, it proves to be advantageous if the width of the cutout proceeding from the outer surface of the third semiconductor zone, in a direction perpendicular to the normal direction relative to the outer surface of the third semiconductor zone, is 200 µm to 1200 µm, in particular 300 µm to 1000 µm.

Furthermore, it proves to be advantageous if at the semiconductor body edge the depth of the cutout in the normal direction relative to the outer surface of the third semiconductor zone is 30 µm to 200 µm.

It should be noted generally at this juncture that, preferably, the semiconductor zones of the first conduction type are formed as p doped semiconductor zones (p conduction type) and the semiconductor zones of the second conduction type are formed as n doped semiconductor zones (n conduction type). Alternatively, the semiconductor zones of the first conduction type can be formed as n doped semiconductor zones (n conduction type) and the semiconductor zones of the second conduction type can be formed as p doped semiconductor zones (p conduction type).

It should be noted that more than one of the elements described in the singular here can optionally be present.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
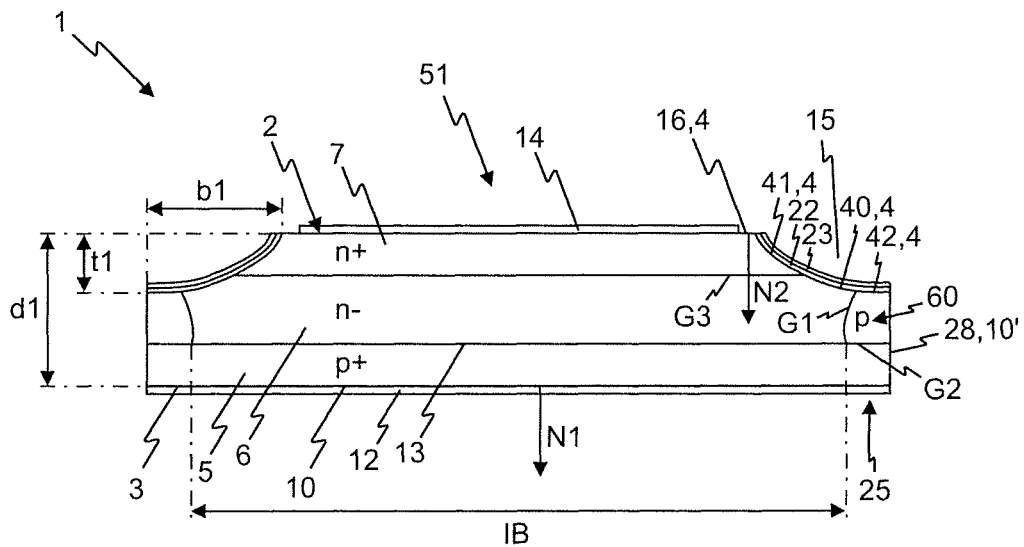
FIG. 1 shows a sectional view of one embodiment of a diode according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'link' or 'connect' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

In the present text, numerous specific details are set forth in order to provide a thorough understanding of exemplary versions of the present invention. It will be apparent, however, to one skilled in the art, that some versions of the present invention may possibly be practiced without some of these specific details. Indeed, reference in this specification to "a variant," "variants," preference, and "one/the variant," or "one version" and the like, should be understood to mean that a particular feature, structure, or characteristic described in connection with the variant or version is included in at least one such variant or version according to the disclosure. Thus, the appearances of phrases such as "in one variant," "in one version," and the like, in various places in the specification are not necessarily all referring to the same version or variant, nor are separate or alternative versions or variants mutually exclusive of other versions or variants. Moreover, various features may be described which possibly may be exhibited by some variants or versions and not by others. Similarly, various requirements are described which may be requirements for some variants or versions, but not others. Furthermore, as used throughout this specification, the terms 'a', 'an', 'at least' do not denote a limitation of quantity, but rather denote the presence of at least one of the referenced item, in the sense that singular reference of an element does not necessarily exclude the plural reference of such elements. Concurrently, the term "a plurality" denotes the presence of more than one referenced items.

Finally, the terms "connected" or "coupled" and related terms are used in an operational sense and are not necessarily limited to a direct connection or coupling.

Various operations may be described as multiple discrete operations in turn, in a manner that may be helpful in understanding embodiments of the present invention; however, the order of description should not be construed to imply that these operations are order dependent.

Figure 2:
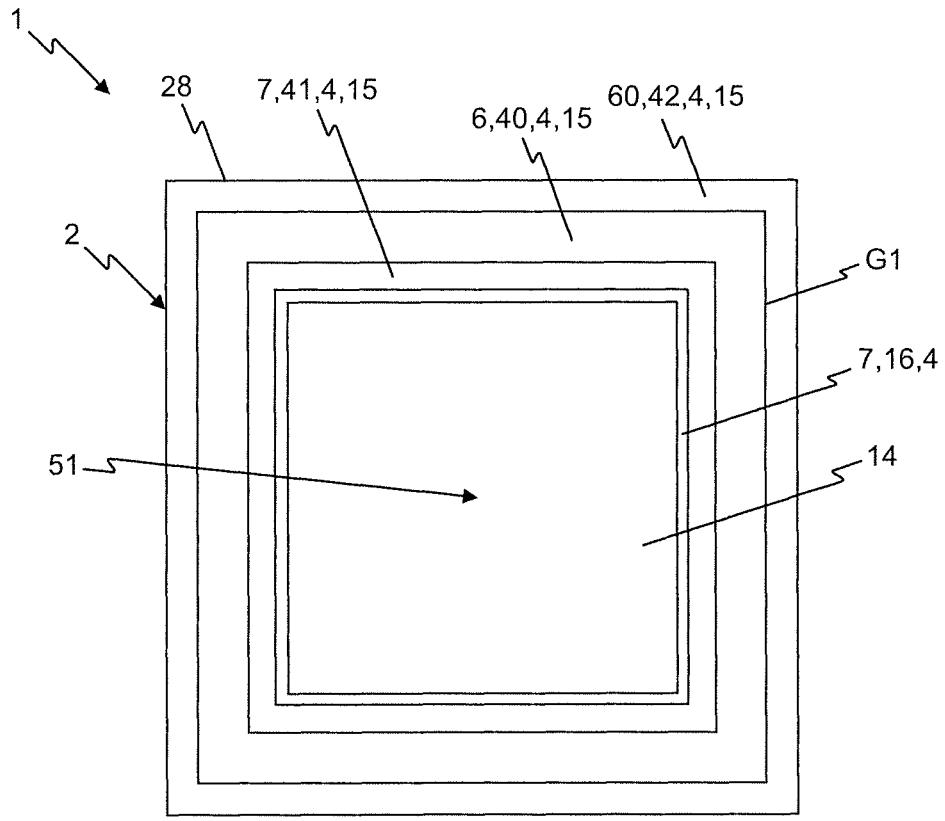
FIG. 2 shows a plan view from above of the diode illustrated in FIG. 1.
Figure 3:
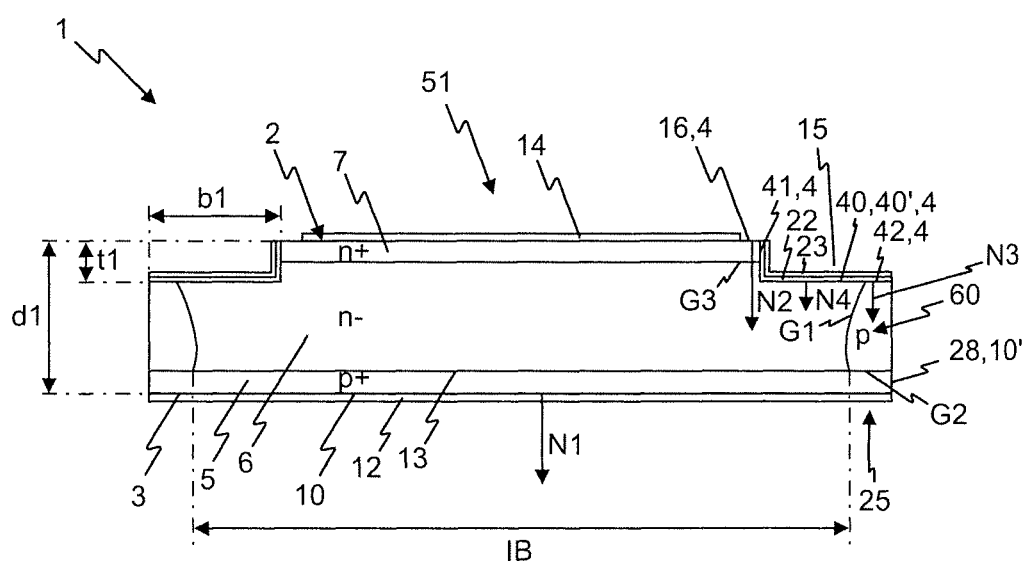
FIG. 3 shows a sectional view of a further embodiment of a diode according to the invention.

FIG. 1 illustrates a sectional view of one embodiment of a diode 1 according to the invention and FIG. 2 illustrates a plan view from above of the diode 1, wherein the diode 1 in FIG. 2 is illustrated in a manner reduced in size by comparison with FIG. 1 and a silicon oxide layer 22 and respectively a polyimide layer 23 or glass layer 23 of the diode 1 are not illustrated. FIG. 3 illustrates a sectional view of a further embodiment of a diode 1 according to the invention.

The diode 1 according to the invention has a semiconductor body 2 having a first semiconductor body main side 3, a second semiconductor body main side 4 arranged opposite the first semiconductor body main side 3, and a semiconductor body edge 28 extending circumferentially around the semiconductor body 2 and connecting the first and second semiconductor body main sides 3 and 4. The semiconductor material of the semiconductor body 2 preferably consists of silicon or silicon carbide.

The semiconductor body 2 has a first semiconductor zone 5 of a first conduction type, wherein a first outer surface 10 of the first semiconductor zone 5 forms the first semiconductor body main side 3. The entire first semiconductor body main side 3 is preferably formed in a planar fashion. A second outer surface 10' of the first semiconductor zone 5 forms a section of the semiconductor body edge 28. The first semiconductor zone 5 extends over the entire semiconductor body 2 in a direction perpendicular to the normal direction N1 relative to the first outer surface 10.

The semiconductor body 2 has a second semiconductor zone 6 of a second conduction type, said second semiconductor zone being arranged on the first semiconductor zone 5 in an inner region IB of the semiconductor body 2 and not extending as far as the semiconductor body edge 28. The semiconductor body 5 furthermore has a third semiconductor zone 7 of the second conduction type, said third semiconductor zone being arranged on the second semiconductor zone 6 and having a higher doping concentration than the second semiconductor zone 6. The third semiconductor zone 7 has a planar outer surface 16, which forms a surface region of the second semiconductor body main side 4. The planar outer surface 16 of the third semiconductor zone 7 is arranged in an inner region 51 of the second semiconductor body main side 4. The normal direction N2 relative to the planar outer surface 16 of the third semiconductor zone 7 corresponds to the normal direction N1 relative to the first outer surface 10 of the first semiconductor zone 5. A boundary G3 between the third semiconductor zone 7 and the second semiconductor zone 6 extends in a direction perpendicular to the normal direction N2 relative to the planar outer surface 16 of the third semiconductor zone 7. The semiconductor body edge 28 extends from the first to the second semiconductor body main side 3, 4 parallel to the normal direction N2 relative to the outer surface 16 of the third semiconductor zone 7.

Furthermore, the semiconductor body 2 has a fourth semiconductor zone 60 of the first conduction type, said fourth semiconductor zone being arranged on the first semiconductor zone 5 in a semiconductor body edge region 25 and extending from the second semiconductor zone 6 in the direction towards the semiconductor body edge 28 as far as the semiconductor body edge 28. The fourth semiconductor zone 60 thus has a boundary G2 with the first semiconductor zone 5. The boundary G2 extends in a direction perpendicular to the normal direction N2 relative to the planar outer surface 16 of the third semiconductor zone 7. The entire fourth semiconductor zone 60 is arranged between a boundary G1 between the fourth semiconductor zone 60 and the second semiconductor zone 6 and the semiconductor body edge 28 in a direction perpendicular to the normal direction N2 relative to the planar outer surface 16 of the third semiconductor zone 7.

The semiconductor body 2 furthermore has a cutout 15 proceeding from the planar outer surface 16 of the third semiconductor zone 7 and reaching as far as the semiconductor body edge 28, said cutout extending along the semiconductor body edge 28, wherein the second semiconductor zone 6 has an outer interface 40 bounding the cutout 15, the third semiconductor zone 7 has an outer interface 41 bounding the cutout 15, and the fourth semiconductor zone 60 has an outer interface 42 bounding the cutout 15. Owing to the cutout 15, the semiconductor body 2 and thus the diode 1 has a MESA edge structure. The cutout 15 extends, as illustrated by way of example in FIG. 2, in a closed manner around the inner region 51 of the second semiconductor body main side 4. The cutout 15 can be realised e.g. by etching or by mechanical processing (e.g. grinding) of the semiconductor body 2. The semiconductor body 2 does not have a further cutout proceeding from the first outer surface 10 of the first semiconductor zone 5.

In the case of the invention, by virtue of the cutout 15, the thickness of the fourth semiconductor zone 60 is relatively small, such that the diffusion process by means of which the fourth semiconductor zone 60 is doped during the production of the diode 1 requires only a relatively short time duration. The fourth semiconductor zone 60 or the diode 1 is thus producible in an efficient manner. Furthermore, owing to the short time duration of the diffusion process required for producing the fourth semiconductor zone 60, fewer impurities are introduced into the semiconductor body 2, which increases the quality of the diode 1.

For electrical connection purposes, the diode 1 has a first metallisation 12 arranged on the outer surface 10 of the first semiconductor zone 5, and a second metallisation 14 arranged on the outer surface 16 of the third semiconductor zone 7. The first metallisation 12 preferably forms an anode metallisation and the second metallisation 14 preferably forms a cathode metallisation.

In the context of the exemplary embodiment in accordance with FIG. 1 and FIG. 2, the outer interface 40 of the second semiconductor zone 6 and the outer interface 41 of the third semiconductor zone 7 have a concave course in the direction towards the semiconductor body edge 28. In this case, preferably, the outer interface 42 of the fourth semiconductor zone 60 likewise has a concave course in the direction towards the semiconductor body edge 28. The entire course of the total outer interface formed from the outer interface 40 of the second semiconductor zone 6, the outer interface 41 of the third semiconductor zone 7 and the outer interface 42 of the fourth semiconductor zone 60 is preferably continuously differentiable in the direction towards the semiconductor body edge 28. The total outer interface formed from the outer interface 40 of the second semiconductor zone 6, the outer interface 41 of the third semiconductor zone 7 and the outer interface 42 of the fourth semiconductor zone 60 preferably has no step.

In the context of the exemplary embodiment in accordance with FIG. 3, the outer interface 42 of the fourth semiconductor zone 60 and a section 40' of the outer interface 40 of the second semiconductor zone 6 are formed in a planar fashion. The normal direction N4 relative to the section 40' of the outer interface 40 of the second semiconductor zone 6 and the normal direction N3 relative to the outer interface 42 of the fourth semiconductor zone 60 preferably correspond to the normal direction N2 relative to the outer surface 16 of the third semiconductor zone 7. Furthermore, the outer interface 41 of the third semiconductor zone 7 is preferably formed in a planar fashion. The normal direction relative to the outer interface 41 of the third semiconductor zone 7 preferably extends in a direction perpendicular to the normal direction N2 relative to the planar outer surface 16 of the third semiconductor zone 7. It should be noted that the embodiment of the diode 1 according to the invention in accordance with FIG. 3, including possible advantageous embodiments, variants, dimensions and doping concentrations, corresponds to the embodiment of the diode 1 according to the invention in accordance with FIGS. 1 and 2 apart from the geometric shape of the cutout 15 or apart from the geometric shape of the outer interfaces 40 and 41 and, if appropriate, the outer interface 42.

The width b1 of the cutout 15 preferably proceeding from the outer surface 16 of the third semiconductor zone 7, in a direction perpendicular to the normal direction N2 relative to the outer surface 16 of the third semiconductor zone 7, is 200 μm to 1200 μm, in particular 300 μm to 1000 μm. At the semiconductor body edge 28 the depth t1 of the cutout 15 in the normal direction N2 relative to the outer surface 16 of the third semiconductor zone 7 is preferably 30 μm to 200 μm. The thickness dl of the semiconductor body 2 is preferably 230 μm to 500 μm, in particular 230 μm to 400 μm.

The first and fourth semiconductor zones 5 and 60 are p doped in the context of the exemplary embodiments, wherein the p type doping may have arisen e.g. as a result of the diffusion of boron, aluminium and/or gallium into the semiconductor material (e.g. silicon or silicon carbide) of the semiconductor body 2. The first semiconductor zone 5 preferably has a doping concentration of $1 \times 10^{18}$ cm$^{-3}$ to $1 \times 10^{21}$ cm$^{-3}$ at its first outer surface 10. Since the doping concentration of the first semiconductor zone 5 is relatively high, it is designated by p+ in the figures. The second and third semiconductor zones 6 and 7 are n doped in the context of the exemplary embodiments, wherein the n type doping may have arisen e.g. as a result of the diffusion of phosphorus into the semiconductor material (e.g. silicon or silicon carbide) of the semiconductor body 2. The second semiconductor zone 6 can have a doping concentration of $1 \times 10^{13}$ cm$^{-3}$ to $1 \times 10^{14}$ cm$^{-3}$. The third semiconductor zone 7 preferably has a doping concentration of $1 \times 10^{18}$ cm$^{-3}$ to $1 \times 10^{21}$ cm$^{-3}$ at its planar outer surface 16. The third semiconductor zone 7 has a higher doping concentration than the second semiconductor zone 6, such that in the figures the doping of the third semiconductor zone 7 is designated by n+ and the doping of the second semiconductor zone 6 is designated by n.

The fourth semiconductor zone 60 preferably has its highest doping concentration at its outer interface 42, wherein the doping concentration of the fourth semiconductor zone 60 decreases in the direction towards the first semiconductor body main side 3, to put it more precisely in the direction towards its boundary G2 with the first semiconductor zone 5. In order to produce this doping concentration profile, a diffusion process, preferably with aluminium, proceeding from the outer interface 42 of the fourth semiconductor zone 60 and extending in the direction towards the first semiconductor body main side 3, to put it more precisely in the direction towards the boundary G2 with the first semiconductor zone 5, is carried out. Alternatively, the fourth semiconductor zone 60 preferably has its highest doping concentration at its boundary G2 with the first semiconductor zone 5, wherein the doping concentration of the fourth semiconductor zone 60 decreases in the direction towards the second semiconductor body main side 4, to put it more precisely in the direction towards the outer interface 42 of the fourth semiconductor zone 60. In order to produce this doping concentration profile, a diffusion process, preferably with aluminium, proceeding from a region of the first outer surface 10 of the first semiconductor zone 5 that is arranged in the semiconductor body edge region 25, and extending in the direction towards the second semiconductor body main side 4, to put it more precisely in the direction towards the outer interface 42 of the fourth semiconductor zone 60, is carried out. In both alternatives, the respective highest doping concentration present in the fourth semiconductor zone 60 is less than $1 \times 10^{18}$ cm 3, in particular less than $1 \times 10^{17}$ cm 3. In the entire fourth semiconductor zone 60, the doping concentration is thus less than $1 \times 10^{18}$ cm 3, in particular less than $1 \times 10^{17}$ cm 3. The entire fourth semiconductor zone 60 thus preferably has a relatively low doping concentration. The diode 1, if the entire fourth semiconductor zone 60 has said relatively low doping concentration, has a higher reverse voltage loading capacity than an otherwise structurally identical diode in which the fourth semiconductor zone 60 has a higher doping concentration.

In all the exemplary embodiments, the semiconductor material of the semiconductor body 2 preferably consists of silicon or silicon carbide, wherein a silicon oxide layer 22 can be arranged at least on one of the outer interfaces 40, 41, 42 of the second, third and fourth semiconductor zones 6, 7, 60. Preferably, as illustrated by way of example in FIG. 1 and FIG. 3, a silicon oxide layer 22 is arranged on the second, third and fourth semiconductor zones 6, 7 and 60.

The silicon oxide layer 22, if the semiconductor material of the semiconductor body 2 consists of silicon or silicon carbide, is preferably produced by the oxidation of the corresponding outer interface 40, 41, 42 of the second, third and fourth semiconductor zones 6, 7 and 60. It should furthermore be noted that, within the meaning of the invention, a layer, in particular electrically non-conductive layer, such as e.g. the silicon oxide layer 22, produced in a surface region of a semiconductor zone of the semiconductor body 2 as a result of chemical reaction (e.g. oxidation) is no longer part of the relevant semiconductor zone 6, 7, and 60, respectively, or of the semiconductor body 2. Within the meaning of the invention, such a chemical reaction enlarges the cutout 15, such that, within the meaning of the invention, a layer produced in such a way, such as e.g. the silicon oxide layer 22, is arranged in the cutout 15 or fills a part of the cutout 15. The silicon oxide of the silicon oxide layer 22 can be present e.g. in the form of silicon monoxide or silicon dioxide or in the form of a mixture of silicon monoxide and silicon dioxide. If the semiconductor material of the semiconductor body 2 consists of silicon carbide, the respective silicon oxide layer can also comprise carbon.

The respective silicon oxide layer 22 can also be produced by means of a coating method (e.g. plasma coating) by the respective outer interface 40, 41, 42 of the second, third and fourth semiconductor zones 6, 7 and 60 being coated with silicon oxide layer. A polyimide layer 23 or a glass layer 23 can additionally be arranged on the silicon oxide layer 22, as illustrated by way of example in FIG. 1 and FIG. 3. If a polyimide layer or glass layer is arranged on the silicon oxide layer, then the polyimide layer has a mechanical contact with the silicon oxide layer or the glass layer.

Alternatively (not illustrated in the figures) it is also possible for only a polyimide layer 23 or glass layer 23 to be arranged on at least one of the respective outer interfaces 40, 41, 42 of the second, third and fourth semiconductor zones 6, 7 and 60.

The polyimide layer or respectively the glass layer and the silicon oxide layer possibly present serve as passivation layers.

It should be noted at this juncture that, in the case of the invention, of course, features of different exemplary embodiments of the invention, provided that the features are not mutually exclusive, can be combined with one another in any desired manner, without departing from the scope of the invention.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A diode, comprising:
a semiconductor body, wherein:
said semiconductor body further comprises:
a first semiconductor body main side;
a second semiconductor body main side arranged opposite the first semiconductor body main side; and
a semiconductor body edge extending circumferentially around the semiconductor body and connecting the first and second semiconductor body main sides;
the semiconductor body has a first semiconductor zone of a first conduction type;
a first outer surface of the first semiconductor zone forms the first semiconductor body main side;
a second outer surface of the first semiconductor zone forms a section of the semiconductor body edge;
the semiconductor body has a second semiconductor zone of a second conduction type; said second semiconductor zone being arranged on the first semiconductor zone in an inner region (IB) of the semiconductor body and not extending as far as the semiconductor body edge;
the semiconductor body has a third semiconductor zone of the second conduction type;
said third semiconductor zone being arranged on the second semiconductor zone and having a higher doping concentration than the second semiconductor zone;
the semiconductor body has a fourth semiconductor zone of the first conduction type;
said fourth semiconductor zone being arranged on the first semiconductor zone in a semiconductor body edge region and extending from the second semiconductor zone in the direction towards the semiconductor body edge as far as the semiconductor body edge;
the semiconductor body has a cutout proceeding from a planar outer surface of the third semiconductor zone, which forms a surface region of the second semiconductor body main side, and reaching as far as the semiconductor body edge;
said cutout extending along the semiconductor body edge, wherein the second, third and fourth semiconductor zones have a respective outer interface bounding the cutout.

2. The diode, according to claim 1, wherein: the entire first semiconductor body main side is formed in a planar fashion.

3. The diode according to claim 2, wherein:
the outer interface of the second semiconductor zone and the outer interface of the third semiconductor zone have a concave course in the direction towards the semiconductor body edge.

4. The diode according to claim 3, wherein:
the outer interface of the fourth semiconductor zone has a concave course in the direction towards the semiconductor body edge.

5. The diode according to claim 2, wherein:
the outer interface of the fourth semiconductor zone and a section of the outer interface of the second semiconductor zone are formed in a planar fashion.

6. The diode according to claim 5, wherein:
respective normal directions (N4, N3) relative to the section of the outer interface of the second semiconductor zone and the outer interface of the fourth semiconductor zone corresponds to a normal direction (N2) relative to the planar outer surface of the third semiconductor zone.

7. The diode according to claim 6, wherein:
the semiconductor body edge extends from the first to the second semiconductor body main sides and parallel to the normal direction (N2) relative to the planar outer surface of the third semiconductor zone.

8. The diode, according to claim 1, wherein:
the fourth semiconductor zone has its highest doping concentration at the outer interface of the fourth semiconductor zone; and wherein the doping concentration of the fourth semiconductor zone decreases in the direction towards the first semiconductor body main side.

9. The diode, according to claim 8, wherein:
the highest doping concentration of the fourth semiconductor zone is less than $1\times10^{18}$ cm$^{-3}$ in particular less than $1\times10^{17}$ cm$^{-3}$.

10. The diode, according to claim 1, wherein:
the fourth semiconductor zone has its highest doping concentration at its boundary (G2) with the first semiconductor zone; and wherein the doping concentration of the fourth semiconductor zone decreases in the direction towards the second semiconductor body main side.

11. The diode, according to claim 10, wherein:
the highest doping concentration of the fourth semiconductor zone is less than $1\times10^{18}$ cm$^{-3}$, in particular less than $1\times10^{17}$ cm$^{-3}$.

12. The diode, according to claim 11, wherein:
a polyimide layer or glass layer is arranged on the silicon oxide layer.

13. The diode according to claim 1, wherein:
a silicon oxide layer is arranged at least on one of the outer interfaces of the second, third and fourth semiconductor zones.

14. The diode according to claim 1, wherein:
at least one of a polyimide layer and glass layer is arranged at least on one of the respective outer interfaces of the second, third and fourth semiconductor zones.

15. The diode according to claim 1, wherein:
a width (b1) of the cutout proceeding from the planar outer surface of the third semiconductor zone, in a direction perpendicular to a normal direction (N2) relative to the planar outer surface of the third semiconductor zone, is 200 µm to 1200 µm, in particular 300 µm to 1000 µm.

16. The diode, according to claim 1, wherein:
the semiconductor body edge having a depth (t1) of the cutout in a normal direction (N2) relative to the planar outer surface of the third semiconductor zone is 30 µm to 200 µm.

* * * * *